United States Patent
Wu et al.

(10) Patent No.: US 8,913,438 B2
(45) Date of Patent: Dec. 16, 2014

(54) ADAPTIVE ARCHITECTURE IN A CHANNEL DETECTOR FOR NAND FLASH CHANNELS

(71) Applicant: LSI Corporation, San Jose, CA (US)

(72) Inventors: Yunxiang Wu, Cupertino, CA (US); Jamal Riani, Fremont, CA (US)

(73) Assignee: Seagate Technology LLC, Cupertino, CA (US)

( * ) Notice: Subject to any disclaimer, the term of this patent is extended or adjusted under 35 U.S.C. 154(b) by 122 days.

(21) Appl. No.: 13/775,559

(22) Filed: Feb. 25, 2013

(65) Prior Publication Data

US 2014/0233322 A1 Aug. 21, 2014

Related U.S. Application Data

(60) Provisional application No. 61/766,853, filed on Feb. 20, 2013.

(51) Int. Cl.
*G11C 16/00* (2006.01)
*G11C 16/04* (2006.01)
*G11C 16/34* (2006.01)

(52) U.S. Cl.
CPC ........ *G11C 16/0408* (2013.01); *G11C 16/3404* (2013.01)
USPC .............. 365/185.24; 365/185.09; 365/185.2

(58) Field of Classification Search
CPC .... G11C 16/10; G11C 16/26; G11C 16/0408; G11C 16/34; G11C 16/3404; G11C 7/04
USPC .............................. 365/185.24, 185.2, 185.09
See application file for complete search history.

(56) References Cited

U.S. PATENT DOCUMENTS

| | | | |
|---|---|---|---|
| 8,125,827 B2 | 2/2012 | Park ......................... | 365/185.09 |
| 8,250,437 B2 | 8/2012 | Sakurada et al. ............. | 714/64 |
| 8,274,823 B2 | 9/2012 | Roohparvar et al. ..... | 365/185.02 |
| 8,332,576 B2 | 12/2012 | Chu et al. ...................... | 711/103 |
| 8,510,636 B2 * | 8/2013 | Ruby et al. ................... | 714/773 |
| 8,665,650 B2 * | 3/2014 | Yang ......................... | 365/185.2 |
| 2012/0063227 A1 | 3/2012 | Weingarten et al. ...... | 365/185.09 |
| 2012/0221772 A1 | 8/2012 | Seol et al. .................... | 711/103 |
| 2012/0236656 A1 | 9/2012 | Cometti .................... | 365/185.22 |
| 2012/0239976 A1 | 9/2012 | Cometti et al. ............... | 714/24 |
| 2013/0003459 A1 | 1/2013 | Ulriksson et al. ......... | 365/185.09 |
| 2013/0024748 A1 | 1/2013 | Sharon et al. ................. | 714/773 |

* cited by examiner

*Primary Examiner* — Tan T. Nguyen
(74) *Attorney, Agent, or Firm* — Christopher P. Maiorana, PC

(57) ABSTRACT

An apparatus comprising a memory configured to store data and a controller. The controller may be configured to process a plurality of input/output requests to read/write to/from the memory. The controller is configured to (i) set a value of a threshold voltage based on an estimate, (ii) determine whether the read is successful, (iii) if the read is not successful, perform a plurality of reads with a varying value of the threshold voltage, (iv) read a calibration value from a look-up table based on the plurality of reads and (v) set the threshold value in response to the calibration value.

20 Claims, 5 Drawing Sheets

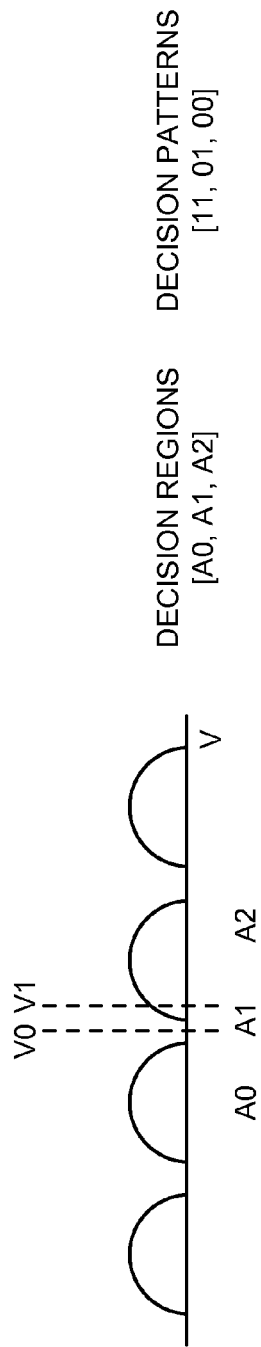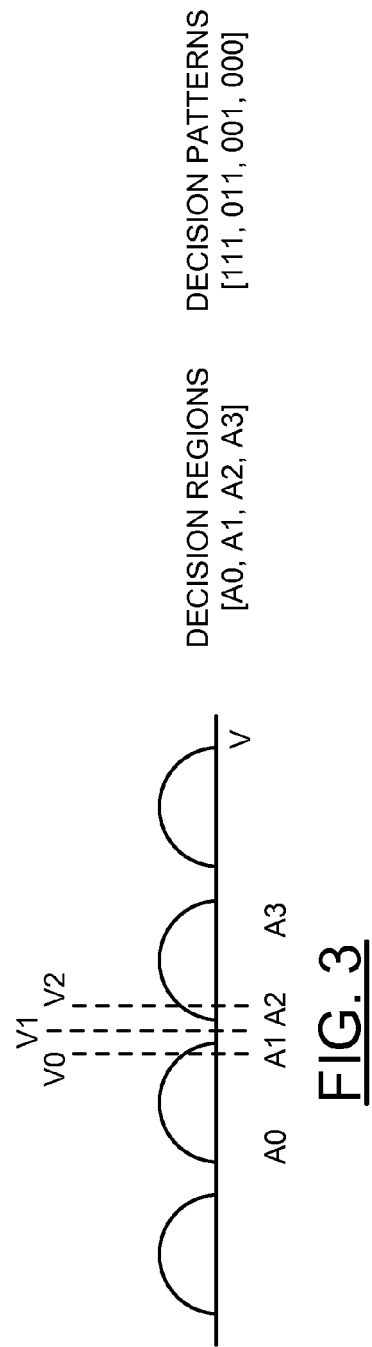

ADAPTIVE ARCHITECTURE IN A CHANNEL DETECTOR FOR NAND FLASH CHANNELS

The present application is related to co-pending U.S. application Ser. No. 13/464,433, filed May 4, 2012, co-pending U.S. application Ser. No. 13/533,130, filed Jun. 26, 2012, U.S. application Ser. No. 13/721,739, filed Dec. 20, 2012, and co-pending international application PCT/US2012/021682, international filing date of Jan. 18, 2012, all of which are incorporated by reference.

FIELD OF THE INVENTION

The present invention relates to storage devices generally and, more particularly, to a method and/or apparatus for implementing an adaptive architecture in a channel detector for NAND flash channels.

BACKGROUND OF THE INVENTION

A typical characteristic of a conventional NAND flash channel is a time-variant function. Age, retention, and geometric location (pages on the edges of a block) of a page can make a cell voltage distribution for one page much different than a cell voltage distribution of another page. The difference is viewed as a time-variant nature. The variations make it difficult for the detector to set optimal read thresholds for every individual page. This has been the major reason of read failures. Therefore, when a hard decision read fails, a conventional strategy is to start a retry read by varying the read thresholds. The intention of such a retry is to hit the sweet spot of the voltage distributions. This kind retry is pretty much both blind (trial and error) and time consuming. At the end of the life of a solid state drive (SSD), throughput performance is expected to become slower due to an increase in retry activities.

It would be desirable to implement adaptive architecture of a channel detector for NAND flash channels.

SUMMARY OF THE INVENTION

The present invention concerns an apparatus comprising a memory configured to store data and a controller. The controller may be configured to process a plurality of input/output requests to read/write to/from the memory. The controller is configured to (i) set a value of a threshold voltage based on an estimate, (ii) determine whether the read is successful, (iii) if the read is not successful, perform a plurality of reads with a varying value of the threshold voltage, (iv) read a calibration value from a look-up table based on the plurality of reads and (v) set the threshold value in response to the calibration value.

The features and advantages of the present invention include providing an adaptive architecture in a channel detector that may (i) be implemented in NAND flash channels, (ii) reduce the number of retry reads to improve throughput performance, (iii) improve retry reliability and/or (iv) be easy to implement.

BRIEF DESCRIPTION OF THE DRAWINGS

These and other features and advantages of the present invention will be apparent from the following detailed description and the appended claims and drawings in which:

FIG. 1 is a diagram illustrating a normal read operation of a lower page of a multi-level cell;

FIG. 2 is a diagram illustrating decision regions and corresponding hard decision patterns for two read operations;

FIG. 3 is a diagram illustrating decision regions and corresponding hard decision patterns for three read operations;

DETAILED DESCRIPTION OF THE PREFERRED EMBODIMENTS

Figure 4:
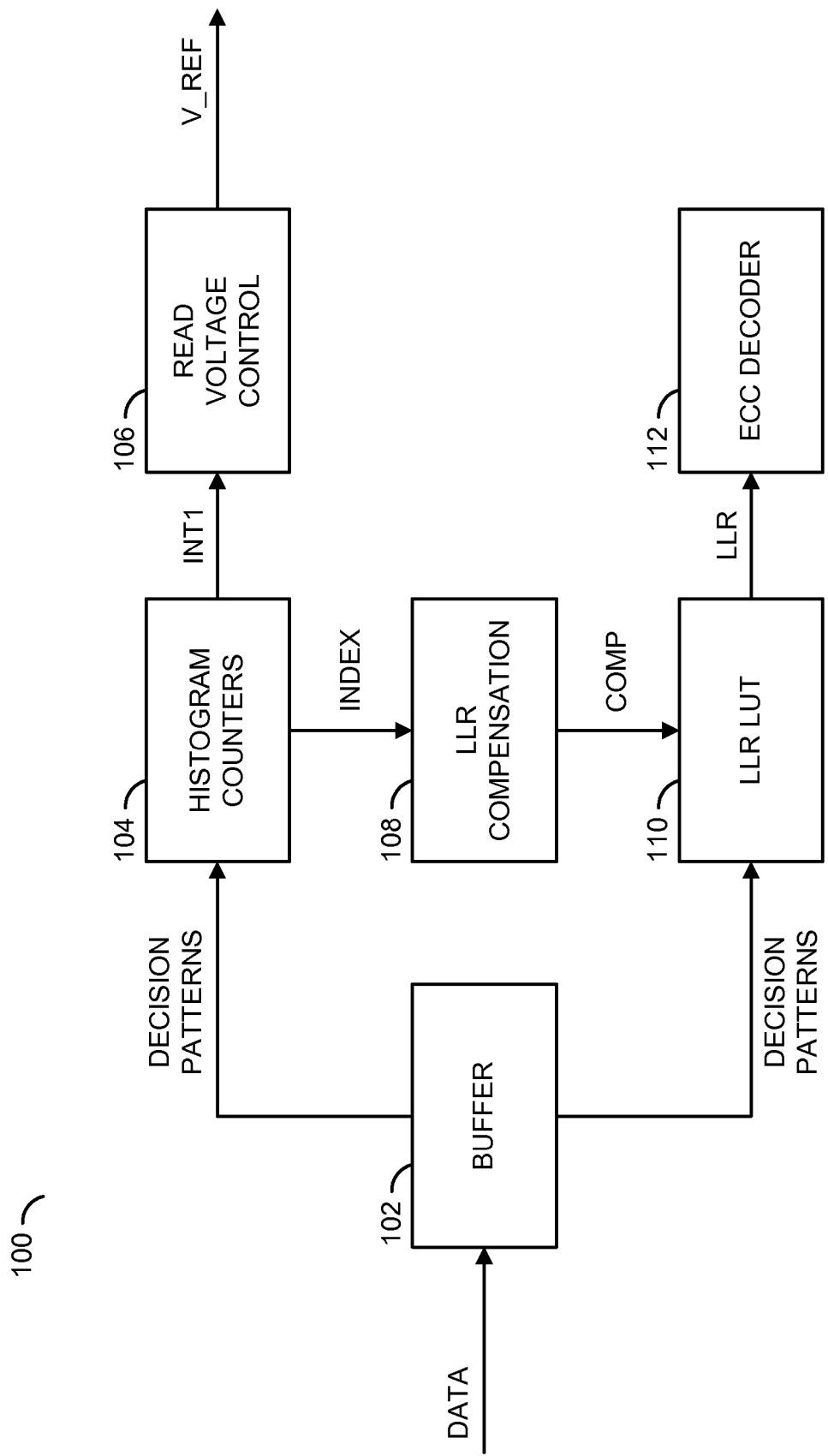
FIG. 4 is a block diagram of an embodiment of the present invention.

Referring to FIG. 1, a read operation of a lower page of a multi-level cell is shown. A read voltage V0 is shown dividing the voltage axis of the cell (horizontal) into two decision regions (e.g., A0 and A1). The corresponding decisions are shown as 0 or 1, respectively. Soft decisions corresponding to 0 or 1 may be obtained if the four distribution parameters are considered. The soft decision with a single read is a fairly rough approximation. A higher quality of soft decisions may be obtained with more reads.

Referring to FIG. 2 an example of decision regions and corresponding hard decision patterns for two read operations is shown. A circuit 110 (to be described in connection with FIG. 4) is responsible for generating a log-likelihood ratio (LLR) look-up table (LUT) for all valid hard decision patterns. A circuit 102 may generate the hard decision patterns based on the multiple page (read) inputs. If non-valid hard decision patterns are present, the circuit 102 is responsible to manage the non-valid pattern to a valid pattern (or erasure). At the output of the circuit 102, each hard decision pattern is represented by an index (4-bit for 7 input pages reads). A circuit 110 performs the look-up operation from an index to a LLR value.

Referring to FIG. 3 an example of decision regions and the corresponding hard decision patterns for three reads is shown. The non-valid decision patterns may be one of [111, 011, 001, 000]. The number of decision patterns shown is N+1, which may represent N reads of a lower page. For an upper page, there may be 2*N hard decision patterns, since a pair of read voltages is used for each read. The following TABLE 1 and TABLE 2 list a number of possible decision patterns with up to seven reads for lower and upper pages, respectively. The patterns are listed assuming each read uses a higher voltage than a previous read.

TABLE 1

| | | | | LSB FUNCTION | | | | |
|---|---|---|---|---|---|---|---|---|
| # Reads | Pattern | Index | # Inputs | Pattern | Index | # Reads | Pattern | Index |
| 2 | 11 | 0 | 3 | 111 | 0 | 4 | 1111 | 0 |
| | 01 | 1 | | 011 | 1 | | 0111 | 1 |
| | 00 | 2 | | 001 | 2 | | 0011 | 2 |
| | | | | 000 | 3 | | 0001 | 3 |
| | | | | | | | 0000 | 4 |
| 5 | 11111 | 0 | 6 | 111111 | 0 | 7 | 1111111 | 0 |
| | 01111 | 1 | | 011111 | 1 | | 0111111 | 1 |
| | 00111 | 2 | | 001111 | 2 | | 0011111 | 2 |
| | 00011 | 3 | | 000111 | 3 | | 0001111 | 3 |
| | 00001 | 4 | | 000011 | 4 | | 0000111 | 4 |
| | 00000 | 5 | | 000001 | 5 | | 0000011 | 5 |
| | | | | 000000 | 6 | | 0000001 | 6 |
| | | | | | | | 0000000 | 7 |

TABLE 2

MSB FUNCTION

| # Reads | Pattern | Index | # Inputs | Pattern | Index | # Reads | Pattern | Index |
|---|---|---|---|---|---|---|---|---|
| 2 | 11 | 0 | 3 | 111 | 0 | 4 | 1111 | 0 |
|   | 01 | 1 |   | 011 | 1 |   | 0111 | 1 |
|   | 00 | 2 |   | 001 | 2 |   | 0011 | 2 |
|   | 10 | 3 |   | 000 | 3 |   | 0001 | 3 |
|   |    |   |   | 100 | 4 |   | 0000 | 4 |
|   |    |   |   | 110 | 5 |   | 1000 | 5 |
|   |    |   |   |     |   |   | 1100 | 6 |
|   |    |   |   |     |   |   | 1110 | 7 |
| 5 | 11111 | 0 | 6 | 111111 | 0 | 7 | 1111111 | 0 |
|   | 01111 | 1 |   | 011111 | 1 |   | 0111111 | 1 |
|   | 00111 | 2 |   | 001111 | 2 |   | 0011111 | 2 |
|   | 00011 | 3 |   | 000111 | 3 |   | 0001111 | 3 |
|   | 00001 | 4 |   | 000011 | 4 |   | 0000111 | 4 |
|   | 00000 | 5 |   | 000001 | 5 |   | 0000011 | 5 |
|   | 10000 | 6 |   | 000000 | 6 |   | 0000001 | 6 |
|   | 11000 | 7 |   | 100000 | 7 |   | 0000000 | 7 |
|   | 11100 | 8 |   | 110000 | 8 |   | 1000000 | 8 |
|   | 11110 | 9 |   | 111000 | 9 |   | 1100000 | 9 |
|   |       |   |   | 111100 | 10 |  | 1110000 | 10 |
|   |       |   |   | 111110 | 11 |  | 1111000 | 11 |
|   |       |   |   |        |    |  | 1111100 | 12 |
|   |       |   |   |        |    |  | 1111110 | 13 |

From the viewpoint of detection theory, a read operation of a NAND flash device includes a process for applying threshold detection. Implementing multiple reads with varying read threshold voltages (e.g., V_REF) is equivalent to applying multiple threshold detection operations. The cell voltage is quantized into more than two regions leading to more than two decision patterns, as shown in FIG. 2 and FIG. 3. The decision patterns are hard decisions. A soft decision can be calculated corresponding to each decision pattern. The soft decisions are usually in the form of log-likelihood ratio (LLR).

Referring to FIG. 4, a block diagram of a circuit 100 is shown in accordance with an embodiment of the present invention. The circuit 100 generally comprises the block (or circuit) 102, the block (or circuit) 104, a block (or circuit) 106, a block (or circuit) 108, a block (or circuit) 110 and a block (or circuit) 112. The circuit 102 may be implemented as a buffer circuit. The circuit 104 may be implemented as a histogram counter circuit. The circuit 106 may be implemented as a read voltage control circuit. The circuit 108 may be implemented as an LLR compensation circuit. The circuit 110 may be implemented as an LLR look-up table (LUT) circuit. The circuit 112 may be implemented as an ECC decoder circuit. The buffer circuit 102 may receive the signal (e.g., DATA). The signal DATA may be a series of read back data operations received from a non-volatile memory circuit. The buffer circuit 102 may generate a signal (e.g., DECISION_PATTERNS) that may be presented to the circuit 104 and/or the circuit 110. The circuit 104 may present a signal (e.g., INT1) to the circuit 106. The circuit 104 may also present a signal (e.g., INDEX) to the circuit 108. The circuit 108 may present a signal (e.g., COMP) to the circuit 110. The circuit 110 may present a signal (e.g., LLR) to the circuit 112.

The circuit 100 may implement a process that progressively gains knowledge of the distributions during retry reads by varying the level of the signal V_REF. Using the updated knowledge, the values of the signal V_REF used for successive reads are optimized to be closer and closer to the desired values. The circuit 100 may implement a strategy for optimizing retry values. The strategy enables a channel detector to adaptively determine the next value of the signal V_REF based on the data from previous reads.

The benefits of the circuit 100 may include (i) reducing the number of retry reads to improve throughput performance, and/or (ii) improving retry reliability (not blind anymore). The circuit 100 may be used together with conventional ECC circuits and/or advanced soft decoded ECC techniques.

One challenge in a detector design of flash channels is dealing with channel variations (e.g., the time-variant nature of the distributions). Although various channel tracking processes may be used, there is no guarantee on the tracking accuracy of each individual page. Lack of tracking accuracy poses a threat to the reliability of a solid state drive (SSD).

The circuit 100 may provide a powerful process for fighting the time-variant nature of NAND flash channels. With the circuit 100, the channel detector is able to adaptively learn the distribution of cell voltages. The circuit 100 is very simple and feasible for implementation. The main hardware/software may include counters for tracking the occurrence of the decision patterns. The circuit 100 greatly improves detection/decoding reliability of pages where channel distributions cannot be accurately tracked.

The task of a channel detector includes two general parts (i) determining the values of the signal V_REF for maximizing channel capacity and/or (ii) calculating the soft decisions corresponding to the values of the signal V_REF. The task is easier to fulfill if the distributions are accurately known. With a predictable distribution, the circuit 100 may not need to focus on how to maximize channel capacity and/or how to calculate soft decisions. Rather, the circuit 100 may be used to progressively update the knowledge of the distributions in an effort to fulfill the task of a detector.

The circuit 100 may be used to calculate read voltages, decision regions, hard decision patterns and/or a decision histogram. The number of decision patterns is normally N+1 for N reads of a lower page. For an upper page, there are a maximum of 2*N hard decision patterns since a pair of read voltages is used for each read. For example, as shown in FIG. 3, there will be three binary bit sequences obtained after the three reads. These sequences should be stored in a data buffer for further processing. Relevant hardware should be built to count the frequency of occurrence of the decision patterns.

Updating knowledge of the channel using the histogram. The frequency of occurrence is actually the histogram of the decision patterns. For the first read (e.g., as shown in FIG. 1), the voltage V0 is desired to be set to the equilibrium point between the two distributions. Therefore, the value of the voltage V0 bears the original estimation of the channel (e.g., cell voltage distributions) when the read is started. Consider an example where the first read uses the voltage V_REF=V1, as shown in FIG. 3. If the first read fails, then the read is set to V_REF=V2. If the second read fails, the next read is set to V_REF=V0. After these three reads, a histogram corresponding to decision regions A0, A1, A2, and A3 is available. The bins corresponding to decision regions A1 and A2 can tell if the original estimation to the channel is accurate or not. If the estimation is accurate, the frequencies (vertical of the histogram) corresponding to bin A1 and A2 should be approximately equal. If the frequency of bin A1 is smaller than that of bin A2, then we know that the equilibrium point between the distributions is actually on the left side of V1.

If error correction decoding fails for the third read, the value of the signal V_REF for the fourth read should be set to the left of V1 (see FIG. 3). After the fourth read, a histogram with five bins will be available, which in turn allows a further estimate about an accurate equilibrium point. This newly gained knowledge will be helpful in determining the next value of the signal V_REF and for compensating the LLRs in case where a soft ECC is implemented.

The adaptive architecture of the circuit 100 may be applied to a variety of systems. For example, a system may be used with a soft ECC (such as LDPC) or a conventional ECC (such as BCH). FIG. 4 shows an example of the circuit 100 using a soft ECC. When a read (detection) starts, the read voltage control circuit 106 sets the signal V_REF based on existing estimation of the channel (e.g., cell voltage distributions). If the read fails, successive reads varying the signal V_REF are performed. The data of the multiple reads are stored in the buffer circuit 102.

Before each successive read, the signal V_REF for the on-going read should be adjusted according to the histogram of previous reads. The LLR look-up table (LUT) 110 is normally prepared based on the latest estimation of the channel (e.g., updated by the histogram of the previous reads). With this architecture, the read voltage control circuit 106 determines a value of the signal V_REF for a subsequent read with more and more accuracy along with the increased number of retries. Conventional retry schemes recommended by NAND manufactures merely and randomly try some values for varying the signal V_REF around the original estimation.

Figure 5:
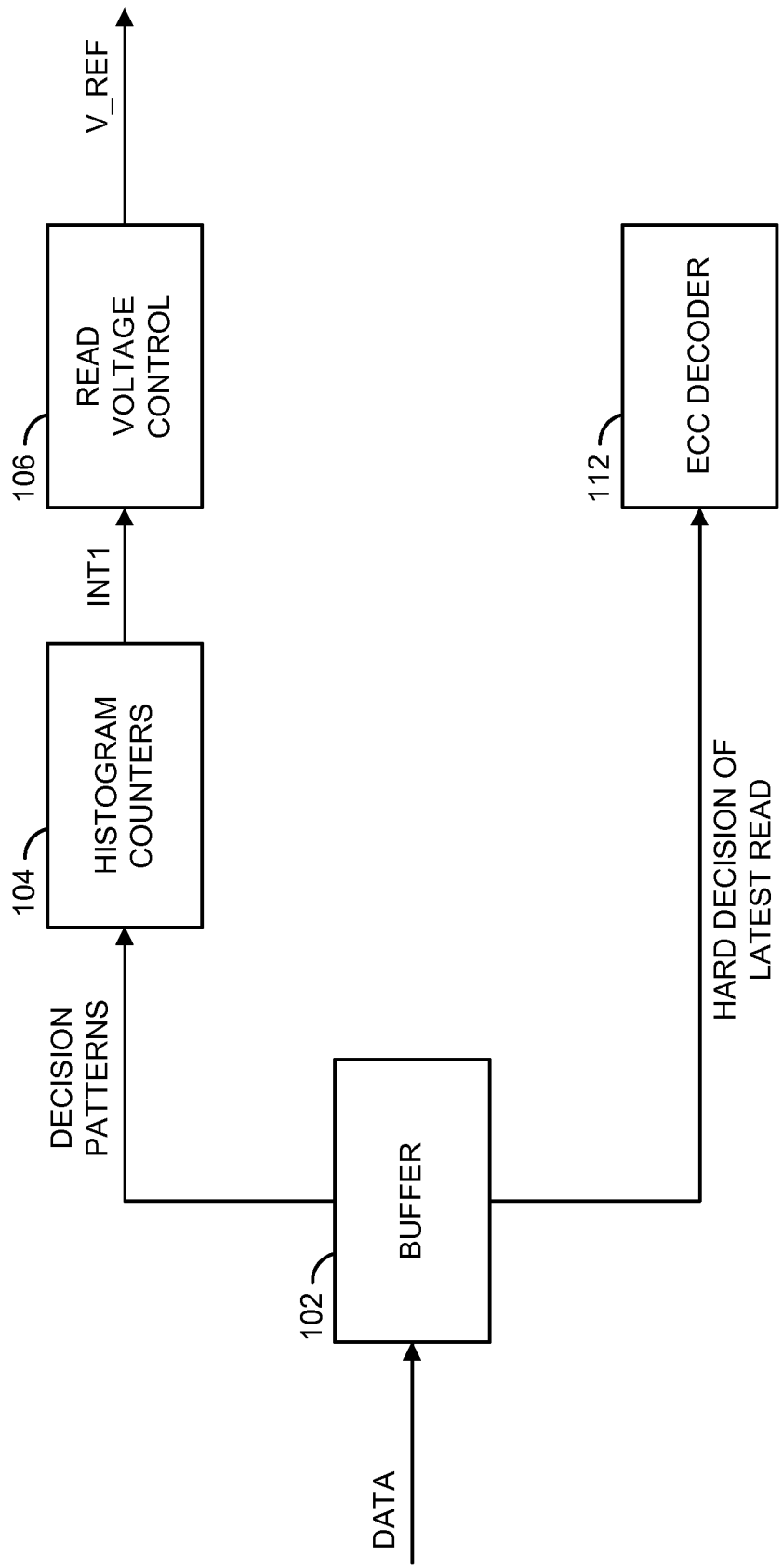
FIG. 5 is a block diagram of an embodiment of the present invention.

Referring to FIG. 5, the adaptive architecture being used together with conventional ECC is shown. In the embodiment of FIG. 5, the histogram is used to continuously adjust the signal V_REF for the next read. With such an implementation, the raw bit error rate after each read can be continuously improved.

Figure 6:
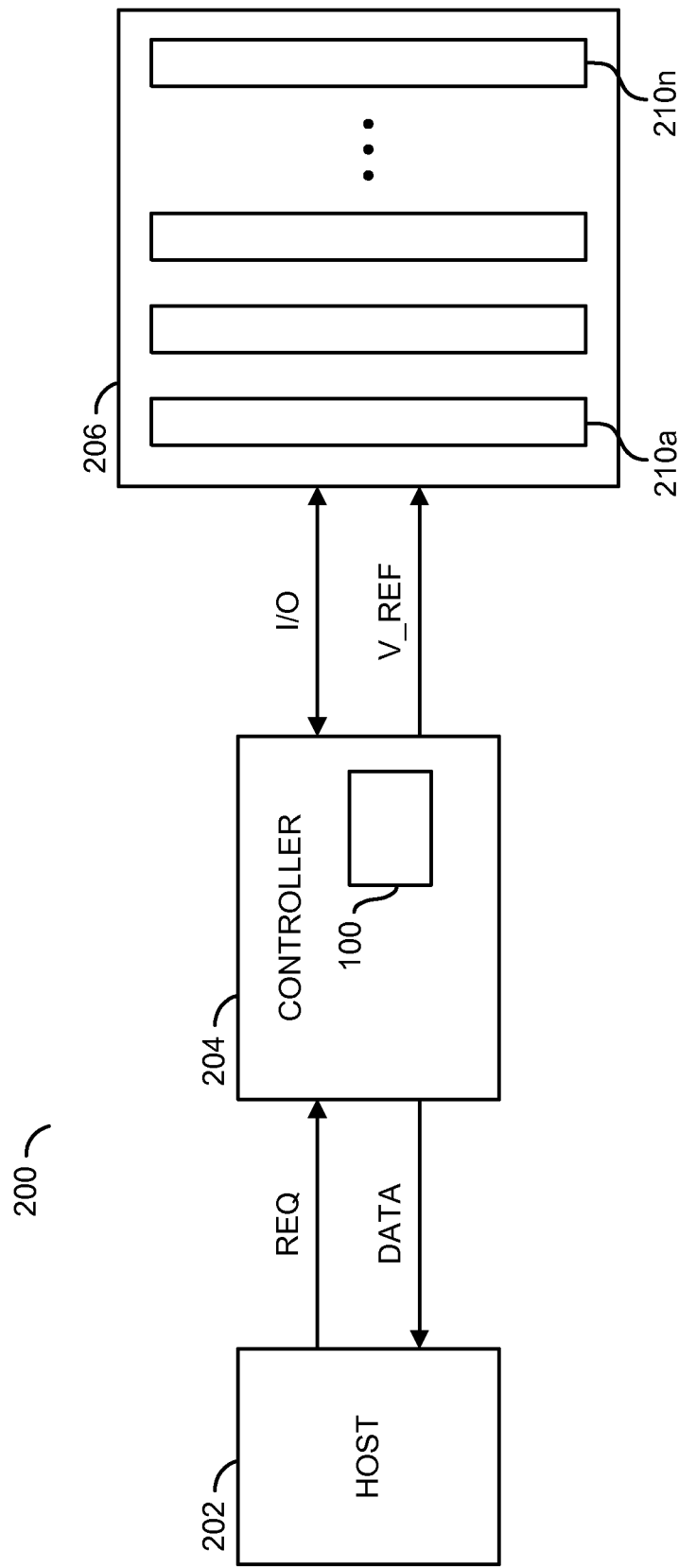
FIG. 6 is a diagram illustrating a context of an embodiment of the invention.

Referring to FIG. 6, a block diagram of an example apparatus 200 is shown. The apparatus 200 may implement a computer having a nonvolatile memory circuit. The apparatus 200 generally comprises a block (or circuit) 202, a block (or circuit) 204 and a block (or circuit) 206. The circuit 204 may include the circuit 100.

A signal (e.g., REQ) may be generated by the circuit 202. The signal REQ may be received by the circuit 204. The signal REQ may be a request signal that may be used to access data from the circuit 206. A signal (e.g., I/O) may be generated by the circuit 204 to be presented to the circuit 206. The signal V_REF may be sent to the circuit 206. In one example, the signal V_REF may be sent on a discrete data line. In another example, the signal V_REF may be sent as part of the signal I/O. The signal REQ may include one or more address bits. A signal (e.g., DATA) may be one or more data portions received by the circuit 202.

The circuit 202 is shown implemented as a host circuit. The circuit 204 reads and writes data to and from the circuit 206. The circuit 206 is generally implemented as a nonvolatile memory circuit. The circuit 206 may include a number of modules 210a-210n. The modules 210a-210n may be implemented as NAND flash chips. In some embodiments, the circuit 206 may be a NAND flash device. In other embodiments, the circuit 204 and/or the circuit 206 may be implemented as all or a portion of a solid state drive having one or more nonvolatile devices. The circuit 206 is generally operational to store data in a nonvolatile condition. When data is read from the circuit 206, the circuit 204 may access a set of data (e.g., multiple bits) identified in the signal REQ.

In some embodiments, the circuit 206 may be implemented as a single-level cell (e.g., SLC) type circuit. An SLC type circuit generally stores a single bit per memory cell (e.g., a logical 0 or 1). In other embodiments, the circuit 206 may be implemented as a multi-level cell (e.g., MLC) type circuit. An MLC type circuit is generally capable of storing multiple (e.g., two) bits per memory cell (e.g., logical 00, 01, 10 or 11). In still other embodiments, the circuit 206 may implement a triple-level cell (e.g., TLC) type circuit. A TLC circuit may be able to store multiple (e.g., three) bits per memory cell (e.g., a logical 000, 001, 010, 011, 100, 101, 110 or 111).

The signal REQ generally spans an address range of the circuit 206. The address range may be divided into multiple groups (or regions). Each group may be divided into one or more sets of data. Each set of data generally incorporates multiple memory cells. The signal WCW may write an entire set (or ECC codeword) into the circuit 206. The signal RCW may read an entire set (or ECC codeword) from the circuit 206.

Figure 7:
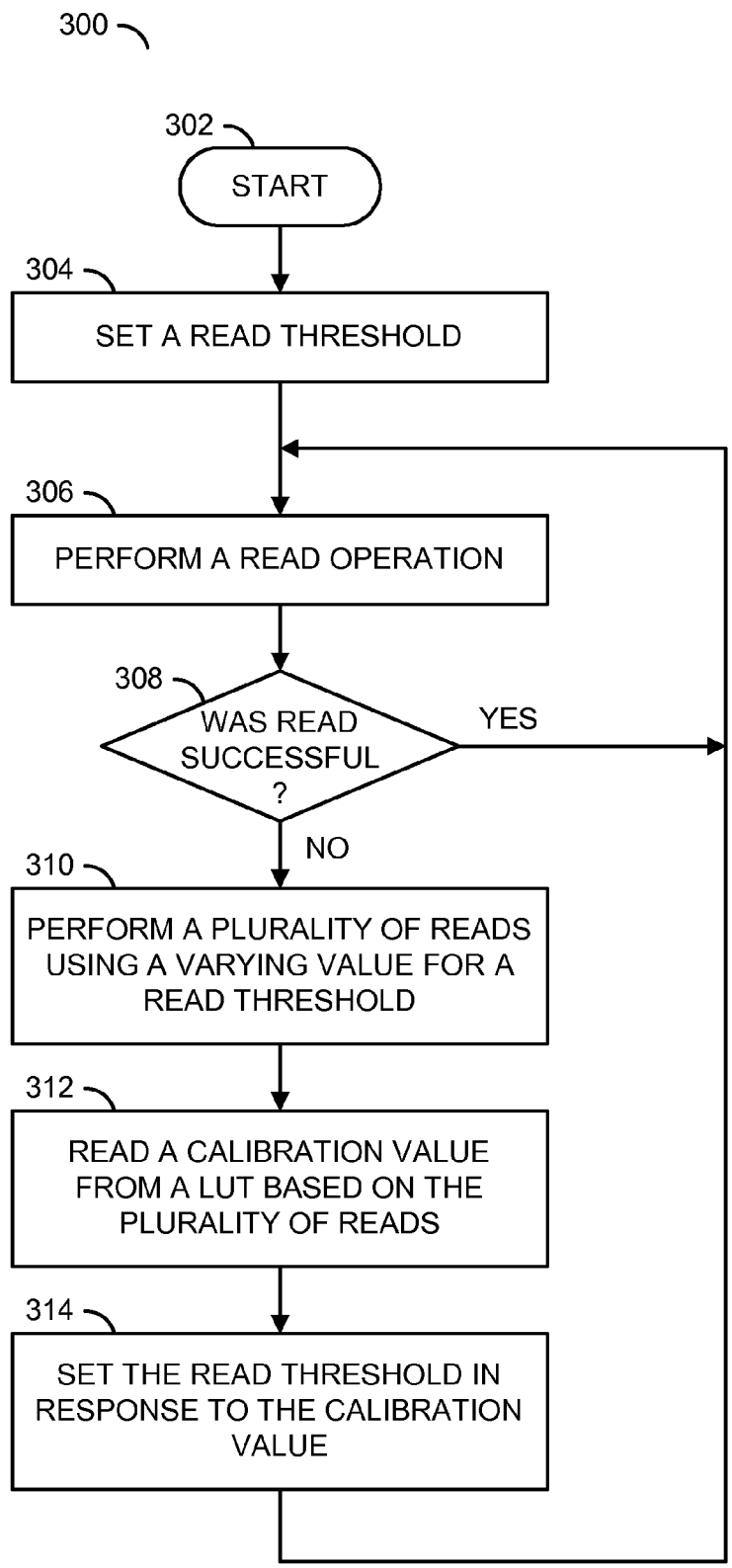
FIG. 7 is a flow diagram of an embodiment of the invention.

Referring to FIG. 7, a flow diagram on an example embodiment is shown. The flow diagram 300 generally comprises a step (or state) 302, a step (or state) 304, a step (or state) 306, a decision step (or state) 308, a decision step (or state) 310, a decision step (or state) 312, and a decision step (or state) 314. The step 302 may be a start state. The step 304 may set a read threshold. The step 306 may perform a read operation. The step 308 may determine whether the read was successful. If so, the method 300 moves back to the state 306. If not, the method 300 moves to the state 310. The state 310 performs a plurality of reads using a varying value for the read threshold V_REF. The state 312 reads a calibration value from the LUT 110 based on the plurality of reads. The state 314 sets the read threshold value V_REF in response to the calibration value.

The functions performed by the diagram of FIG. 7 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to the preferred embodiments thereof, it will be understood by those skilled in the art that various changes in form and details may be made without departing from the scope of the invention.

The invention claimed is:

1. A method for adjusting a threshold voltage in a read channel, comprising the steps of:
   (A) setting a value of said threshold voltage based on an estimate;
   (B) determining whether said read is successful;
   (C) if said read is not successful, performing a plurality of reads with a varying value of said threshold voltage;
   (D) reading a calibration value from a look-up table based on said plurality of reads; and
   (E) setting said threshold value in response to said calibration value.

2. The method according to claim 1, wherein said read channel is implemented in a memory.

3. The method according to claim 2, wherein said memory comprises a flash memory.

4. The method according to claim 2, wherein memory comprises a NAND flash memory.

5. The method according to claim 2, wherein said memory comprises a plurality of modules.

6. The method according to claim 2, wherein said memory comprises a solid state drive (SSD).

7. The method according to claim 1, wherein said plurality of reads comprises a histogram.

8. The method according to claim 1, wherein said look-up table comprises a log-likelihood ratio (LLR) table.

9. An apparatus comprising:
   a memory configured to store data; and
   a controller configured to process a plurality of input/output requests to read/write to/from said memory, wherein said controller is configured to (i) set a value of a threshold voltage based on an estimate, (ii) determine whether said read is successful, (iii) if said read is not successful, perform a plurality of reads with a varying value of said threshold voltage, (iv) read a calibration value from a look-up table based on said plurality of reads and (v) set said threshold value in response to said calibration value.

10. The apparatus according to claim 9, wherein said apparatus calculates an error value used by an ECC decoder.

11. The apparatus according to claim 9, wherein said memory includes a plurality of page signals each representing a bit sequence resulting from a plurality of reads at a plurality of voltages.

12. The apparatus according to claim 9, wherein said memory comprises a flash memory.

13. The apparatus according to claim 9, wherein (i) said look-up table stores a plurality of calibration values, and (ii) each of each said calibration values is retrieved in response to an index signal.

14. An apparatus comprising:
   an interface configured to process a plurality of read/write operations to/from a memory; and
   a control circuit configured to (i) set a value of a threshold voltage based on an estimate, (ii) determine whether said read operation is successful, (iii) if said read operation is not successful, perform a plurality of read operations with a varying value of said threshold voltage, (iv) read a calibration value from a look-up table based on said plurality of read operations and (v) set said threshold value in response to said calibration value.

15. The apparatus according to claim 14, wherein said apparatus calculates an error value used by an ECC decoder.

16. The apparatus according to claim 14, wherein said memory includes a plurality of page signals each representing a bit sequence resulting from a plurality of read operations at a plurality of voltages.

17. The apparatus according to claim 14, wherein said memory comprises a flash memory.

18. The apparatus according to claim 14, wherein (i) said look-up table stores a plurality of calibration values, and (ii) each of said calibration values is retrieved in response to an index signal.

19. The apparatus according to claim 14, wherein said look-up table comprises a log-likelihood ratio (LLR) table.

20. The apparatus according to claim 14, wherein said plurality of read operations comprises a histogram.

* * * * *

UNITED STATES PATENT AND TRADEMARK OFFICE
CERTIFICATE OF CORRECTION

PATENT NO. : 8,913,438 B2  
APPLICATION NO. : 13/775559  
DATED : December 16, 2014  
INVENTOR(S) : Yunxiang Wu and Jamal Riani Page 1 of 1

It is certified that error appears in the above-identified patent and that said Letters Patent is hereby corrected as shown below:

In the Claims

Column 8, Claim 13, line 29, delete "each" (second occurrence).

Signed and Sealed this  
Seventh Day of April, 2015

Michelle K. Lee  
*Director of the United States Patent and Trademark Office*